United States Patent
Ker et al.

(10) Patent No.: US 6,750,515 B2
(45) Date of Patent: Jun. 15, 2004

(54) SCR DEVICES IN SILICON-ON-INSULATOR CMOS PROCESS FOR ON-CHIP ESD PROTECTION

(75) Inventors: Ming-Dou Ker, Hsinchu (TW); Kei-Kang Hung, Chutung Hsinchu (TW); Chyh-Yih Chang, Hsinghuang (TW)

(73) Assignee: Industrial Technology Research Institute (TW)

( * ) Notice: Subject to any disclaimer, the term of this patent is extended or adjusted under 35 U.S.C. 154(b) by 0 days.

(21) Appl. No.: 10/062,714

(22) Filed: Feb. 5, 2002

(65) Prior Publication Data

US 2003/0146474 A1 Aug. 7, 2003

(51) Int. Cl.[7] .......................... H01L 27/76; H01L 29/94; H01L 31/062; H01L 31/113; H01L 31/119; H01L 27/01; H01L 27/12; H01L 31/0392; H01L 23/62

(52) U.S. Cl. ..................... 257/357; 257/338; 257/347; 257/350; 257/355; 257/356; 257/368; 257/369; 257/371

(58) Field of Search ................ 257/350, 288, 257/347, 338, 355, 356, 357, 368, 369, 371, 546

(56) References Cited

U.S. PATENT DOCUMENTS

| | | |
|---|---|---|
| 4,939,616 A | 7/1990 | Rountree |
| 5,012,317 A | 4/1991 | Rountre |
| 5,225,702 A | 7/1993 | Chatterjee |
| 5,453,384 A | 9/1995 | Chatterjee |
| 5,465,189 A | 11/1995 | Polgreen et al. |
| 5,502,328 A | 3/1996 | Chen et al. |
| 5,519,242 A | 5/1996 | Avery |
| 5,581,104 A | 12/1996 | Lowrey et al. |
| 5,629,544 A | 5/1997 | Voldman et al. |
| 5,631,793 A * | 5/1997 | Ker et al. ................... 361/56 |
| 5,646,808 A | 7/1997 | Nakayama |
| 5,654,862 A | 8/1997 | Worley et al. |
| 5,719,737 A | 2/1998 | Maloney |
| 5,754,381 A | 5/1998 | Ker |
| 5,807,791 A | 9/1998 | Bertin et al. |
| 5,811,857 A | 9/1998 | Assaderaghi et al. |
| 5,824,573 A * | 10/1998 | Zhang et al. ............... 438/150 |
| 5,907,462 A | 5/1999 | Chatterjee et al. |
| 5,910,874 A | 6/1999 | Iniewski et al. |
| 5,932,918 A | 8/1999 | Krakauer |
| 5,940,258 A | 8/1999 | Duvvury |

(List continued on next page.)

OTHER PUBLICATIONS

M–D. Ker, et al., "CMOS On–Chip ESD Protection Design with Substrate–triggering Technique," Proc. of ICECS, vol. 1, pp. 273–276, 1998.

C. Duvvury et al., "Dynamic Gate Coupling for NMOS for Efficient Output ESD Protection", Proc. of IRPS, pp. 141–150, 1992.

(List continued on next page.)

Primary Examiner—Nathan J. Flynn
Assistant Examiner—Victor A. Mandala, Jr.
(74) Attorney, Agent, or Firm—Finnegan, Henderson, Farabow, Garrett & Dunner, L.L.P.

(57) ABSTRACT

A silicon-on-isolator CMOS integrated circuit device includes a semiconductor substrate, an isolation layer formed over the semiconductor substrate, an n-type MOS transistor having a gate, a drain region, and a source region formed over the isolation layer, and a p-type MOS transistor having a gate, a drain region, and a source region formed over the isolation layer and contiguous with the n-type MOS transistor, wherein the n-type MOS transistor and the p-type MOS transistor form a silicon controlled rectifier to provide electrostatic discharge protection.

35 Claims, 10 Drawing Sheets

U.S. PATENT DOCUMENTS

| | | | |
|---|---|---|---|
| 5,990,520 | A | 11/1999 | Noorlag et al. |
| 6,015,992 | A | 1/2000 | Chatterjee et al. |
| 6,034,397 | A | 3/2000 | Voldman |
| 6,081,002 | A | 6/2000 | Amerasekera et al. |
| 6,242,763 | B1 * | 6/2001 | Chen et al. .............. 257/107 |
| 6,521,952 | B1 * | 2/2003 | Ker et al. ................ 257/360 |
| 2002/0084490 | A1 * | 7/2002 | Ker et al. ................ 257/355 |
| 2003/0007301 | A1 * | 1/2003 | Ker et al. ................ 361/111 |

OTHER PUBLICATIONS

N. K. Verghese and D. Allstot, "Verification of RF and Mixed–Signed Integrated Circuits for Substrate Coupling Effects", in *Proc. of IEEE Custom Integrated Circuits Conf.*, 1997, pp. 363–370.

M.Xu, D. Su, D. Shaeffer, T.Lee, and B. Wooley, "Measuring and Modeling the Effects of Substrate Noise on LNA for a CMOS GPS Receiver, "*IEEE Journal of Solid–State Circuits*, vol. 36, pp. 473–485, 2001.

R. Gharpurey, "A Methodology for Measurement and Characterization of Substrate Noise in High Frequency Circuits," in *Proc. of IEEE Custom Intergrated Circuits Conf.*, 1999, pp. 487–490.

M. Nagata, J. Nagai, K. Hijikata, T. Morie, and A. Iwata, "PhysicalDesign Guides for Substate Noise Reduction in CMOS Digital Circuits, "*IEEE Journal of Solid–State Circuits*, vol. 36, pp. 539–549, 2001.

M.–D. Ker, T–Y, Chen, C–Y. Wu, and H.–H. Chang, "ESD Protection Design on Analog Pin WIth Very Low Input Capacitance for High–Frequency or Current–Mode Applications, "*IEEE Journal of Solid–State Circuits*, vol. 35, pp. 1194–1199, 2000.

M.–D. Ker, "Whole–Chip ESD Protection Design with Efficient VDD–to–VSS ESD Clamp Circuit for Submicron CMOS VLSI, "*IEEE Trans. on Electron Devices*, vol. 46, pp. 173–183, 1999.

C. Richier, P. Salome, G. Mabboux, I. Zaza, A. Juge, and P. Mortini, "Investigation on Different ESD Protection Strategies Devoted to 3.3V RF Applications (2 (GHz) in a $0.18 \mu m$ CMOS Process, "in Proc. of EOS/ESD Symp., 200, pp. 251–259.

T.–Y. Chen and M.–D. Ker, "Design on ESD Protection Circuit With Low and Constant Input Capacitance," *in Proc. of IEEE Int. Symp. on Quality Electronic Design*, 2001, pp. 247–247.

M.–D. Ker, T.–Y. Chen, C.–Y. Wu, and H.–H. Chang, "ESD Protection Design on Analog Pin WIth Very Low Input Capacitance for RF or Current–Mode Applications, "*IEEE Journal of Solid–State Circuits*, vol. 35, pp. 1194–1199, 2000.

S. Voldman, et al. , "Semiconductor Process and Structural Optimization of Shallow Trench Isolation–Defined and Polysilicon–Bound Source/Drain Diodes for ESD Networks," in Proc. of EOS/ESD Symp., 1998, pp. 151–160.

S. Voldman, et al., "Analysis of Snubber–Clamped Diode–String Mixed Voltage Interface ESD Protection Network for Advanced Microprocessors," in Proc. of EOS/ESD symposium, 1995, pp. 43–61.

M.J. Pelgrom, et al., "A 3/5 V Compatible I/O Buffer," IEEE Journal of Solid–State Circuits, vol. 30, No. 7, pp. 823–825, Jul. 1995.

G.P. Singh, et al., "High–Voltage–Tolerant I/OBuffers with Low–Voltage CMOS Process," IEEE Journal of Solid–State Circuits, vol. 34, No. 11, pp. 1512–1525, Nov. 1999.

H. Sanchez, et al., "A Versatile 3.3/2.5/1.8–V CMOS I/O Driver Built in 02. –$\mu m$, 3.5–nm Tox, 1.8 –V CMOS Technology, " IEEE Journal of Solid–State Circuits, vol.34 No. 11.pp. 1501–1511, Nov. 1999.

* cited by examiner

SCR DEVICES IN SILICON-ON-INSULATOR CMOS PROCESS FOR ON-CHIP ESD PROTECTION

DESCRIPTION OF THE INVENTION

1. Field of the Invention

This invention pertains in general to a semiconductor device and, more particularly, to an electrostatic discharge protection circuit incorporating a silicon controlled rectifier in a silicon-on-insulator semiconductor device.

2. Background of the Invention

Recent advances in integrated circuits have included further development of a silicon-on-insulator (SOI) technology. An SOI technology uses an insulating substrate to improve process characteristics such as speed and latch-up susceptibility. There are two types of SOI processes, fully-depleted and partially-depleted.

In an SOI complementary metal-oxide semiconductor (CMOS) technology, an independent and isolated n-type metal-oxide semiconductor (NMOS) transistor may be provided next to a p-type MOS (PMOS) transistor, and vice versa, because the NMOS and PMOS transistors are electrically isolated from each other and from the underlying silicon substrate. The main advantage of the SOI CMOS technology includes high immunity to latch-up, low junction capacitance, and low junction leakage current. The latch-up problems can be avoided because the source and drain regions of the transistors are surrounded by an insulator. In addition, an absence of diode junctions around the source and drain regions further reduces leakage current and junction capacitances. However, the SOI CMOS technology is still susceptible to an electrostatic discharge (ESD) event due to poor thermal conductivity of the insulator, e.g., buried oxide, and the floating body effect from active devices being formed over the insulator instead of a semiconductor substrate.

An ESD event refers to a phenomenon of electrical discharge of a current (positive or negative) for a short duration during which a large amount of current is provided to an integrated circuit (IC). The large current may be built-up from a variety of sources, such as the human body. To protect ICs from an ESD event, many schemes have been implemented, including use of a silicon controlled rectifier (SCR). A feature of an SCR is its voltage-holding ability, at approximately 1 volt, in a non-epitaxial bulk CMOS process. In addition, an SCR can sustain high current and hold the voltage across the SCR at a low level, and may be implemented to bypass high current discharges associated with an ESD event.

A conventional SCR device has a switching voltage of more than 30 volts in sub-micron CMOS processes, and therefore is not suitable to protect gate oxides in a sub-micron CMOS technology. FIG. 1 is a reproduction of FIG. 3 of U.S. Pat. No. 5,012,317 to Rountre, entitled "Electrostatic Discharge Protection Circuit." Rountre describes a lateral SCR structure made up of a P+ type region 48, an N-type well 46, a P-type layer 44, and an N+ region 52. According to Rountre, a positive current associated with an ESD event flows through region 48 to avalanche a PN junction between well 46 and layer 44. The current flows from layer 44 to region 52 across the PN junction and ultimately to ground to protect an IC from the ESD event. However, a disadvantage of the SCR structure shown in FIG. 1 is its susceptibility to being accidentally triggered by substrate noise.

In addition, the p-n—p-n path of an SCR device, such as the device shown in FIG. 1, is blocked by the insulator layer and shallow trench isolations (STIs) in ICs formed with the SOI CMOS technology. Accordingly, SCR devices have been proposed in an integrated circuit based on the SOI CMOS technology. FIG. 2 is a reproduction of FIG. 4 of U.S. Pat. No. 6,015,992 to Chatterjee, entitled "Bistable SCR-like switch for ESD protection of silicon-on-insulator integrated circuits." Chatterjee describes an "SCR-like switch" provided by a first transistor 42 and a second transistor 44, that are separated from each other by an insulation region 60. The bistable SCR-like device has two additional lines 62, 64 to electrically connect the separate transistors.

SUMMARY OF THE INVENTION

In accordance with the invention, there is provided an integrated circuit device that includes a semiconductor substrate, an isolation layer formed over the semiconductor substrate, and a layer of silicon material, formed over the isolation layer, including a first p-type portion, a first n-type portion contiguous with the first p-type portion, a second p-type portion contiguous with the first n-type portion, a second n-type portion contiguous with the second p-type portion, a third p-type portion contiguous with the second n-type portion, and a third n-type portion contiguous with the third p-type portion. The first, second, and third p-type portions and the first, second, and third n-type portions collectively form a rectifier, the first p-type portion and the first n-type portion form a cathode of the rectifier, and the third n-type portion and the third p-type portion form an anode of the rectifier.

In yet another aspect, the second n-type portion includes the third n-type portion and the third p-type portion, each of which being spaced apart from the isolation layer.

In another aspect, the second p-type portion includes a fourth n-type portion formed spaced apart from the first n-type portion, and the first n-type portion and the fourth n-type portion define a source region and a drain region of an NMOS transistor.

In still another aspect, the second n-type portion includes a fourth p-type portion formed spaced apart from the third p-type portion, and the third p-type portion and the fourth p-type portion define a source region and a drain region of a PMOS transistor.

Also in accordance with the present invention, there is provided an integrated circuit device that includes a semiconductor substrate, an isolation layer formed over the semiconductor substrate, an n-type MOS transistor having a gate, a drain region, and a source region formed over the isolation layer, and a p-type MOS transistor having a gate, a drain region, and a source region formed over the isolation layer and contiguous with the n-type MOS transistor, wherein the n-type MOS transistor and the p-type MOS transistor form a rectifier to provide electrostatic discharge protection.

In another aspect, the integrated circuit device further comprises an electrostatic discharge circuit for providing the bias voltage to trigger the rectifier. The electrostatic discharge circuit comprising a first inverter including a first PMOS transistor having a gate, a source region and a drain region, and a first NMOS transistor having a gate, a source region and a drain region, wherein the gate of the first PMOS transistor is coupled to the gate of the first NMOS transistor, and the gate of the p-type MOS transistor is coupled to the drain region of the first PMOS transistor and the drain region of the first NMOS transistor.

In yet another aspect, the electrostatic discharge circuit further comprises a second inverter, including a second PMOS transistor having a gate, a source region and a drain region, and a second NMOS transistor having a gate, a source region and a drain region, wherein the gate of the second PMOS transistor is coupled to the gate of the second NMOS transistor, and the gate of the n-type MOS transistor is coupled to the drain region of the second PMOS transistor and the drain region of the second NMOS transistor.

In still another aspect, the cathode is coupled to at least one diode to prevent the rectifier from being triggered in a non-ESD operation.

Further in accordance with the present invention, there is provided a method for protecting a silicon-on-insulator semiconductor circuit from electrostatic discharge that includes providing an n-type MOS transistor having a source region and a drain region in the silicon-on-insulator circuit, providing a p-type MOS transistor having a source region and a drain region, the p-type MOS transistor being contiguous with the n-type MOS transistor, providing a p-type region contiguous with one of the source region and the drain region of the n-type MOS transistor to form a cathode, and providing an n-type region contiguous with one of the source region and the drain region of the p-type MOS transistor to form an anode, wherein the n-type region, the p-type region, the p-type MOS transistor and the n-type MOS transistor form a rectifier.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the present exemplary embodiments of the invention, examples of which are illustrated in the accompanying drawings. Wherever possible, the same reference numbers will be used throughout the drawings to refer to the same or like parts.

The present invention provides a silicon controlled rectifier (SCR) structure to protect an integrated circuit, manufactured using a SOI CMOS technology, from an ESD event. The SCR structure of the present invention includes an NMOS transistor and a PMOS transistor, each of which may be triggered by an optional detection circuit, and may employ polysilicon gates to block STI regions to provide compact SCR structures. In addition, the SCR structures of the present invention may be controlled for improved trigger speed, which, in turn, provides improved ESD protection.

Figure 1:
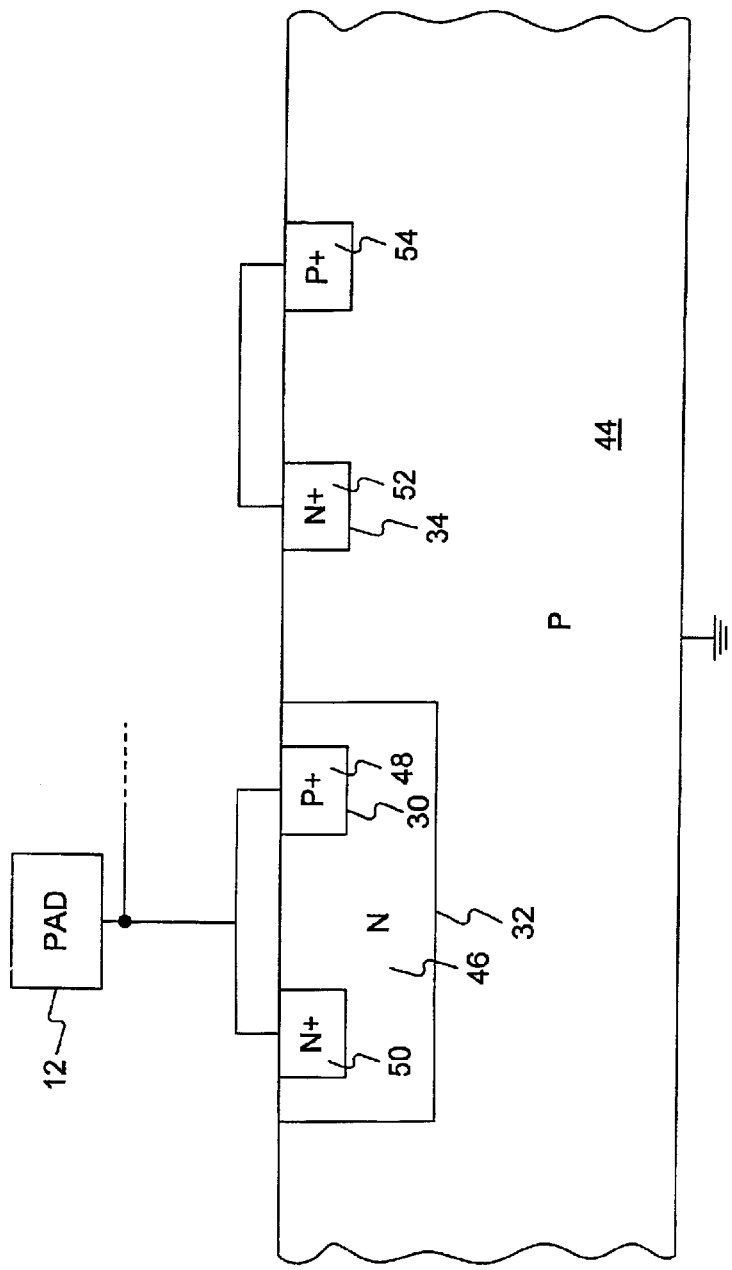
FIG. 1 is a cross-sectional view of a known silicon controlled rectifier.
Figure 2:
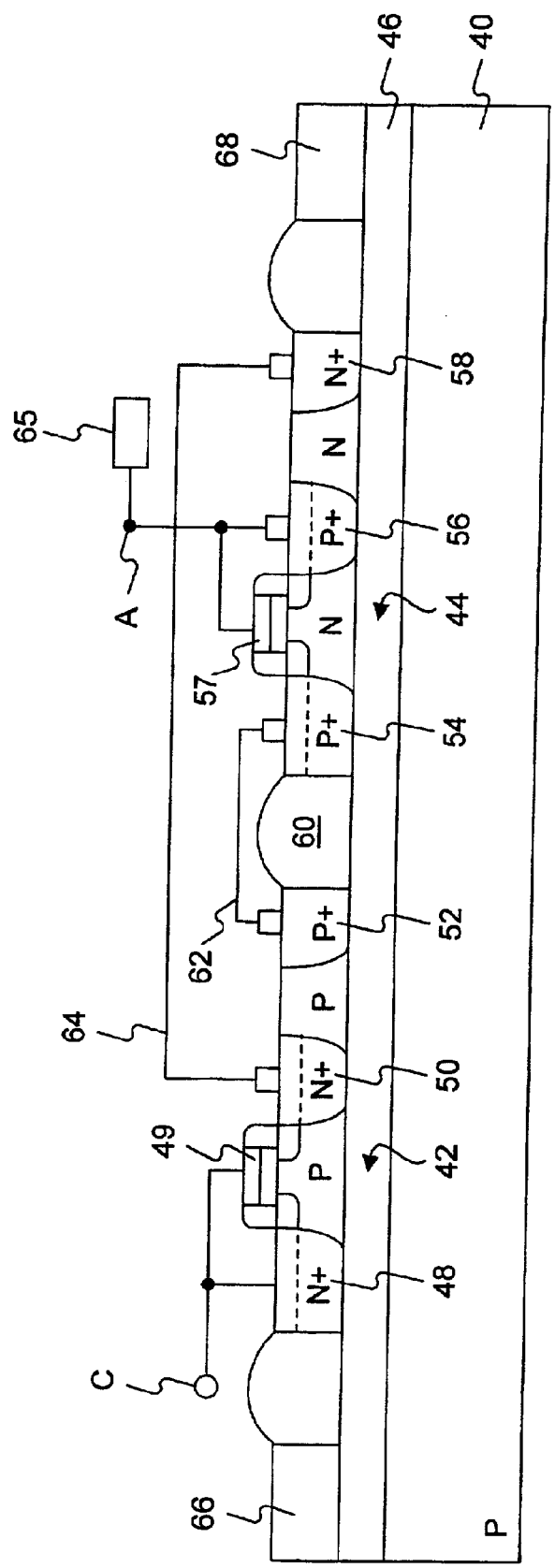
FIG. 2 is a cross-sectional view of another known silicon controlled rectifier.
Figure 3:
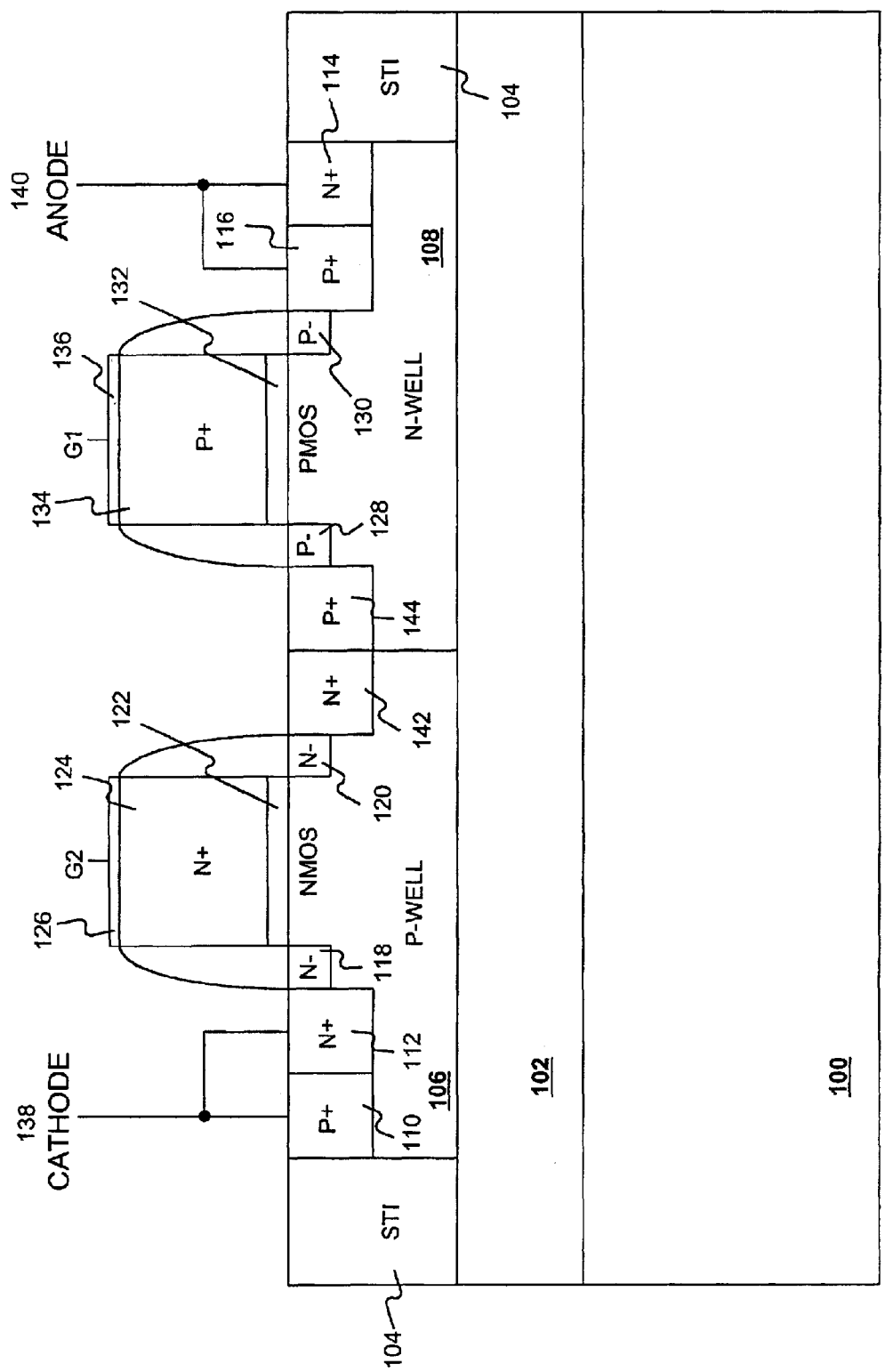
FIG. 3 is a cross-sectional view of an SCR structure in accordance with an embodiment of the present invention.

FIG. 3 is a cross-sectional view of an SCR structure of an embodiment consistent with the present invention and formed using a partially-depleted SOI CMOS process. Referring to FIG. 3, an integrated circuit device includes a semiconductor substrate 100. In the present embodiment, semiconductor substrate 100 is a p-type substrate. An isolation, or insulation, layer 102, such as a buried oxide, is formed over semiconductor substrate 100. A layer of silicon material (not numbered) is formed over isolation layer 102 and includes a p-well 106 and an n-well 108 contiguous with p-well 106. Both p-well 106 and n-well 108 are lightly doped regions defined by a diffusion process. A junction is formed between P-well 106 and n-well 108.

A heavily-doped first p-type portion 110 and a heavily-doped first n-type portion 112 are formed in p-well 106 and spaced apart from isolation layer 102. In other words, neither first p-type portion 110 nor first n-type portion 112 is contiguous with isolation layer 102. A junction is formed between first n-type portion 112 and p-well 106. First p-type portion 110 has a doping concentration higher than that of p-well 106. A heavily-doped second p-type portion 116 and a heavily-doped second n-type portion 114 are formed inside n-well 108 and spaced apart from isolation layer 102. A junction is formed between second p-type portion 116 and n-well 108. Second n-type portion 114 has a doping concentration higher than that of n-well 108. First n-type portion 112, p-well 106, n-well 108, second p-type portion 116, and second n-type portion 114 collectively form an SCR structure consistent with the present invention. First p-type portion 110 and first n-type portion 112 form a cathode 138 of the SCR structure, and second p-type portion 116 and second n-type portion 114 form an anode 140 of the SCR structure. Each of cathode 138 and anode 140 receives an ESD current.

A third n-type portion 142 is formed in p-well 106 and spaced apart from first n-type portion 112, wherein each of first n-type portion 112 and third n-type portion 142 define one of a source region or a drain region of an NMOS transistor (not numbered). The NMOS transistor may further include a fourth n-type portion 118 and a fifth n-type portion 120. Specifically, first n-type portion 112 has a doping concentration higher than that of fourth n-type portion 118, and together form one of the source and drain regions of the NMOS transistor. Third n-type portion 142 has a doping concentration higher than that of fifth n-type portion 120, and together form another one of the source and drain regions of the NMOS transistor. The NMOS transistor also includes a gate oxide 122 formed over p-well 106. The NMOS transistor further includes a gate 124 provided over gate oxide 122 and between n-type regions 118 and 120, and a conducting polycide layer 126 formed over gate 124. Sidewall spacers (not numbered) are formed on the sides of gate 124.

Similarly, a third p-type portion 144 is formed in n-well 108 and spaced apart from second p-type portion 116, wherein second p-type portion 116 and third p-type portion 144 define a source region and a drain region of a PMOS transistor (not numbered). The PMOS transistor may further include a fourth p-type portion 128 and a fifth p-type portion 130. Specifically, third p-type portion 144 has a doping concentration higher than that of fourth p-type portion 128, and together form one of the source and drain regions of the PMOS transistor. Second p-type portion 116 has a doping concentration higher than that of fifth p-type portion 130, and together form another one of the source and drain regions of the PMOS transistor. The PMOS transistor also includes a gate oxide 132 formed over n-well 108. The PMOS transistor additionally includes a gate 134 provided over gate oxide 132 and between p-type regions 128 and 130, and a polycide 136 is formed over gate 134. Sidewall spacers (not numbered) are formed on the sides of gate 134. Shallow trench isolations (STIs) 104 are formed over isolation layer 102 and contiguous with the SCR structure.

In operation, when a positive transient voltage is received at anode 140, the SCR structure shown in FIG. 3 turns on to conduct the transient current to cathode 138. The transient current flows from anode 140 to p-type portion 116 and then n-well 108. The transient current then flows from n-well 108 to p-well 106, and then across the junction between p-well 106 and n-type portion 112 to cathode 138.

When a negative transient voltage is received at cathode 138, the SCR structure turns on to conduct the transient current to anode 140. The negative transient current flows from cathode 138 to n-type portion 112 and then p-well 106. The transient current then flows from p-well 106 to n-well 108, and then to p-type portion 116 and anode 140.

Providing an appropriate voltage to gate 124 would turn on the NMOS transistor of the SCR, and the NMOS transistor is triggered to conduct a current flow from third n-type portion 142 to n-type portion 112. Likewise, the PMOS transistor of the SCR structure could be turned on by providing an appropriate voltage to gate 134 and, as a result, the PMOS transistor is triggered to conduct a current flow in the direction from p-type portion 116 to n-type portion 114. Either the NMOS transistor or the PMOS transistor having being turned on causes forward biasing of the SCR structure, which turns on the SCR structure.

Figure 4:
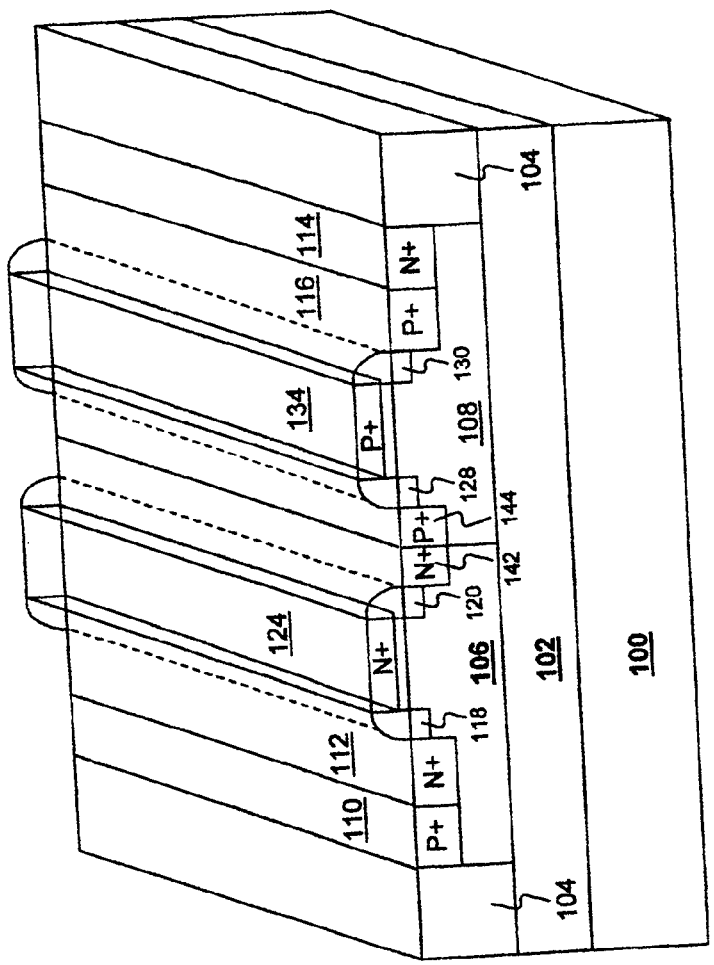
FIG. 4 is a perspective view of the SCR structure shown in FIG. 3.

FIG. 4 is a perspective view of the SCR structure shown in FIG. 3. For illustrative purposes, the upper interconnect layers are not shown. Referring to FIG. 4, a p-type substrate 100 is provided with a layer of isolation layer 102 disposed over substrate 100. Isolation layer 102 may be an implanted layer formed according to any known SOI CMOS technology. A layer of silicon material (not numbered) is then formed over isolation layer 102. Active circuits are formed on or in the silicon material. As such, the active circuits are isolated from the substrate and may be insulated laterally with STIs 104.

Figure 5:
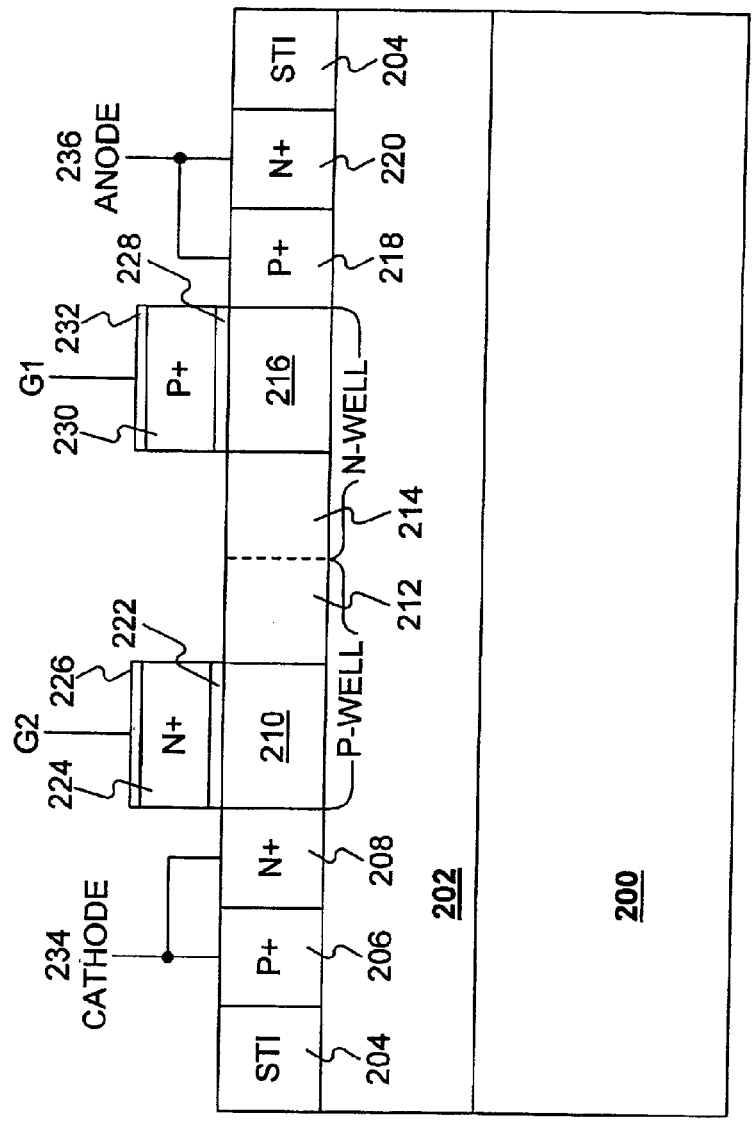
FIG. 5 is a cross-sectional view of an SCR structure in accordance with another embodiment of the present invention.

FIG. 5 is a cross-sectional view of an SCR structure in accordance with another embodiment consistent with the present invention and formed in a fully-depleted SOI CMOS process. Referring to FIG. 5, an integrated circuit device includes a semiconductor substrate 200. In the present embodiment, semiconductor substrate 200 is a p-type substrate. An isolation, or insulation, layer 202, such as a buried oxide, is formed over semiconductor substrate 200. A layer of silicon material (not numbered) is formed over isolation layer 202 and includes a p-well 210 and an n-well 216 contiguous with p-well 210. Both p-well 210 and n-well 216 are lightly-doped regions defined by a diffusion process. A junction is formed between P-well 210 and n-well 216.

A heavily-doped first p-type portion 206 is formed over isolation layer 202. A heavily-doped first n-type portion 208 is formed over isolation layer 202 and contiguous with first p-type portion 206 and p-well 210. A junction is formed between first n-type portion 208 and p-well 210. First p-type portion 206 has a doping concentration higher than that of p-well 210. A heavily-doped second n-type portion 220 is formed over isolation layer 202. A heavily-doped second p-type portion 218 is formed over isolation layer 202 and contiguous with second n-type portion 220 and n-well 216. A junction is formed between second p-type portion 218 and n-well 216. Second n-type portion 220 has a doping concentration higher than that of n-well 216. First p-type portion 206, first n-type portion 208, p-well 210, n-well 216, second p-type portion 218, and second n-type portion 220 collectively form an SCR structure consistent with the present invention. First p-type portion 206 and first n-type portion 208 form a cathode 234 of the SCR structure, and second p-type portion 218 and second n-type portion 220 form an anode 236 of the SCR structure. Each of cathode 234 and anode 236 receives an ESD current.

A third n-type portion 212 is formed in p-well 210 and spaced apart from first n-type portion 208, wherein each of the first n-type portion 208 and third n-type portion 212 define a source region or a drain region of an NMOS transistor (not numbered). The NMOS transistor also includes a gate oxide 222 formed over p-well 210. The NMOS transistor further includes a gate 224 provided over gate oxide 222 and between n-type regions 208 and 212, and a conducting polycide layer 226 is formed over gate 224.

Similarly, a third p-type portion 214 is formed in n-well 216 and spaced apart from second p-type portion 218, wherein each of the second p-type portion 218 and third p-type portion 214 define a source region or a drain region of a PMOS transistor (not numbered). The PMOS transistor also includes a gate oxide 228 formed over n-well 216. The PMOS transistor additionally includes a gate 230 provided over gate oxide 222 and between p-type regions 218 and 214, and a polycide layer 232 is formed over gate 230. Shallow trench isolations (STIs) 204 are formed over isolation layer 202 and contiguous with the SCR structure. The SCR structure shown in FIG. 5 operates in the same manner as the SCR device shown in FIG. 3.

Figure 6:
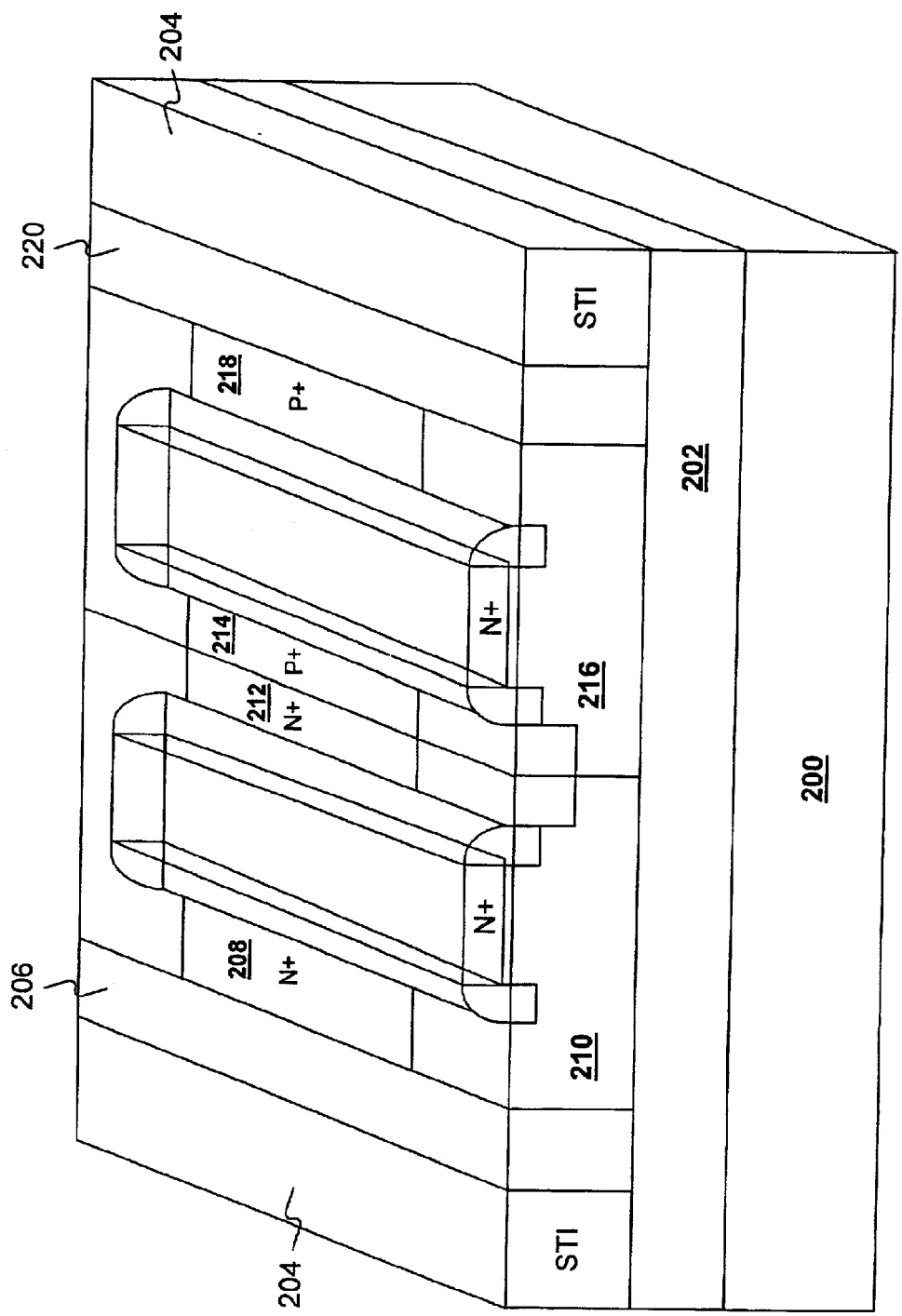
FIG. 6 is a perspective view of the SCR structure shown in FIG. 5.

FIG. 6 is a perspective view of the SCR structure shown in FIG. 5. For illustrative purposes, the upper interconnect layers are not shown. Referring to FIG. 6, a p-type substrate 200 is provided with a layer of isolation layer 202 disposed over substrate 200. Isolation layer 202 may be an implanted layer formed according to any known SOI CMOS technology. A layer of silicon material (not numbered) is then deposited over isolation layer 202. Active circuits are formed on or in the silicon material. As such, the active circuits are isolated from the substrate and may be insulated laterally with STIs 204.

Figure 7A:
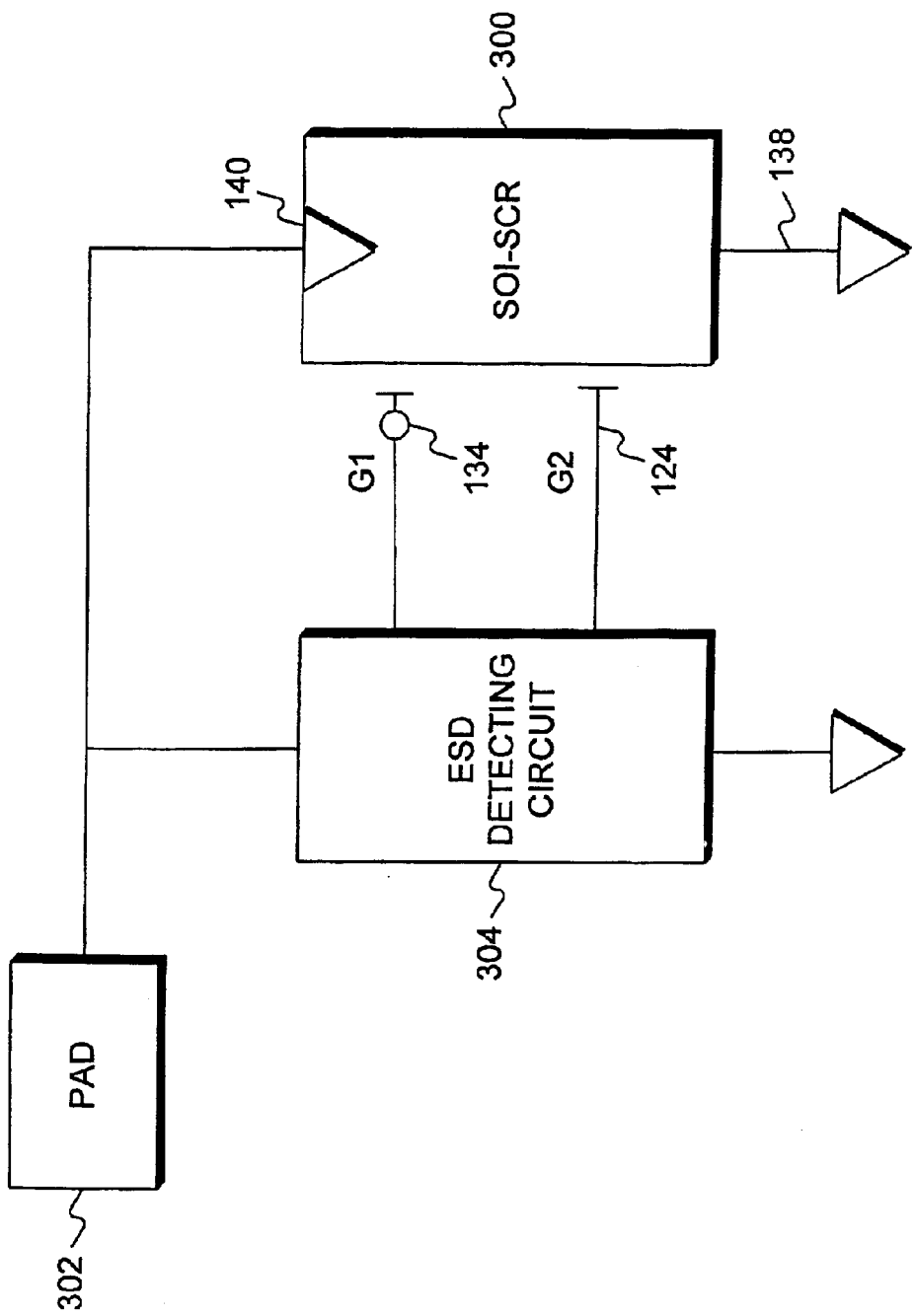
FIG. 7A is a circuit block diagram showing an embodiment for implementing the SCR structure shown in FIGS. 3 and 5.

FIG. 7A is a circuit block diagram showing an embodiment for implementing the SCR structure shown in FIGS. 3 and 5 to provide ESD protection. Referring to FIG. 7A, an SCR device 300 having the structure shown in FIG. 3 is conceptually represented as a four-terminal device, having anode 140, cathode 138, gate 134 of its PMOS transistor (not shown), and gate 124 of its NMOS transistor (not shown). Anode 140 is coupled to a pad 302, and cathode 138 is coupled to ground. Each of gates 134 and 124 is coupled to an ESD detecting circuit 304, which operates to reduce the turn-on time of SCR device 300. Up occurrence of an ESD event, ESD detecting circuit 304 detects an ESD transient pulse on pad 302 and provides a bias voltage to one or both of gates 134 and 124 to trigger SCR device 300 to discharge ESD current.

Figure 7B:
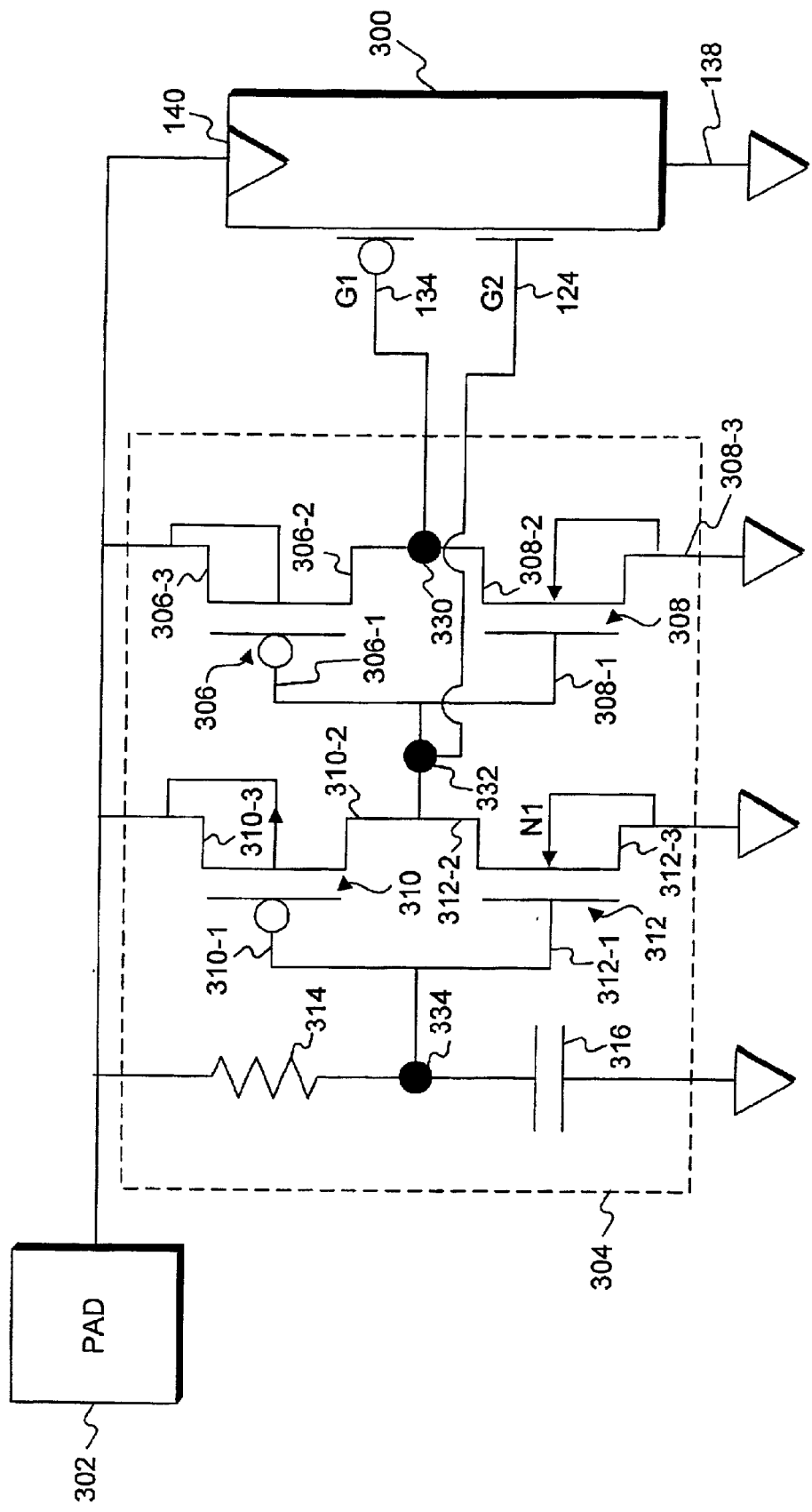
FIG. 7B is a detailed circuit diagram of FIG. 7A.

FIG. 7B is a detailed circuit diagram of FIG. 7A. Referring to FIG. 7B, ESD detecting circuit 304 includes a first transistor-pair including a PMOS transistor 306 having a gate 306-1, a source region 306-3 and a drain region 306-2, and an NMOS transistor 308 having a gate 308-1, a source region 308-3 and a drain region 308-2. Gate 306-1 of PMOS transistor 306 is coupled to gate 308-1 of NMOS transistor 308. Gate 134 is coupled at a node 330 to drain region 306-2 of PMOS transistor 306 and drain region 308-2 of NMOS transistor 308. Source 306-3 of PMOS transistor 306 is coupled to pad 302 and anode 140 of the SCR device 300. Source 308-3 of NMOS transistor 308 is coupled to ground.

ESD detecting circuit 304 also includes a second transistor-pair including a PMOS transistor 310 having a gate 310-1, a source region 310-3 and a drain region 310-2, and an NMOS transistor 312 having a gate 312-1, a source region 312-3 and a drain region 312-2. Gate 310-1 of PMOS transistor 310 is coupled to gate 312-1 of NMOS transistor 312. Gate 124 is coupled at a node 332 to drain region 310-2 of PMOS transistor 310, drain region 312-2 of the NMOS transistor 312, gate 306-1 of PMOS transistor 306, and gate 308-1 of NMOS transistor 308. Source 310-3 of PMOS transistor 310 is coupled to pad 302, anode 140 of the SCR device 300, and source 306-3 of PMOS transistor 306. Source 312-3 of NMOS transistor 312 is coupled to ground.

ESD detecting circuit 304 further includes a resistor 314 and a capacitor 316. Resistor 314 is coupled to pad 302 at one end, and at a node 334 coupled to gate 310-1 of PMOS transistor 310, and gate 312-1 of NMOS transistor 312, and capacitor 316 at the other end. Capacitor 316 is coupled between node 334 and ground.

In operation, each of the first and second transistor-pairs functions as inverters. In normal operation, node 334 is at a high voltage level, and one of the inverters functions to provide a low voltage at node 332. Therefore, a low voltage is provided to gate 124 of the NMOS transistor to keep the NMOS transistor off so that SCR device 300 remains off. Likewise, the other one of the inverters functions to provide a high voltage to node 330. Thus, a high voltage is provided to gate 134 of the PMOS transistor to keep the PMOS transistor off so that SCR device 300 remains off.

In an ESD event, a positive ESD pulse is presented across VDD-VSS power rails. Therefore, in response to the positive pulse, node 334 is initially at a low voltage level, which is inverted into a high voltage level at node 332. This high voltage level is provided to gate 124 of the NMOS transistor to turn on the NMOS transistor, which triggers the SCR device 300. The high voltage level at node 332 is inverted by the first transistor pair to a low voltage level at node 330 to turn on the PMOS transistor of SCR device 300. As a result, SCR device 300 is turned on and conducts to bypass the ESD current. When both the PMOS and NMOS transistors of the SCR device 300 are turned on, the reaction time to turn on the SCR device 300 is significantly reduced.

Figure 8A:
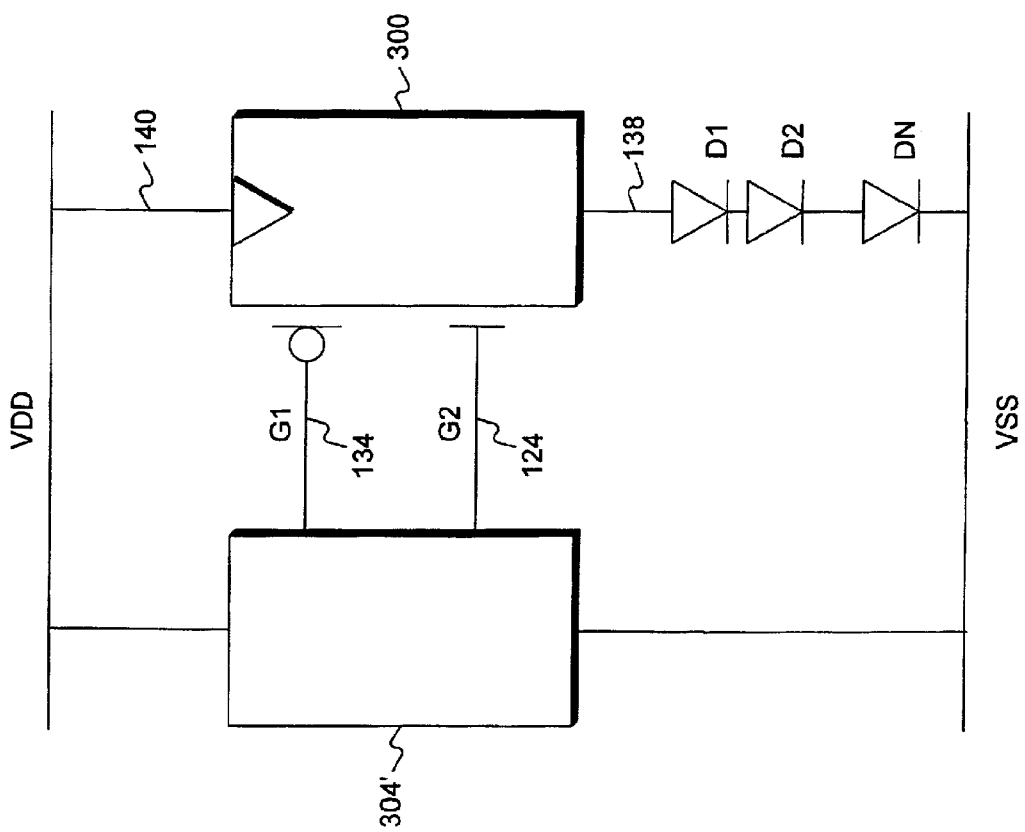
FIG. 8A is a circuit block diagram showing another embodiment for implementing the SCR structure shown in FIGS. 3 and 5.

FIG. 8A is a circuit block diagram showing another embodiment for implementing the SCR structure shown in FIG. 3 to provide ESD protection. FIG. 8A is similar to FIG. 7A, except that it includes an ESD detecting circuit 304', that SCR device 300 is coupled across VDD-VSS power rails, and that cathode 138 of SCR device 300 is coupled to a plurality of serially connected diodes D1 . . . Dn. Diode D1 is coupled to cathode 138 and diode Dn is coupled to ground, i.e., the VSS power rail. In one embodiment, cathode 138 of SCR device 300 is coupled to a single diode.

Figure 8B:
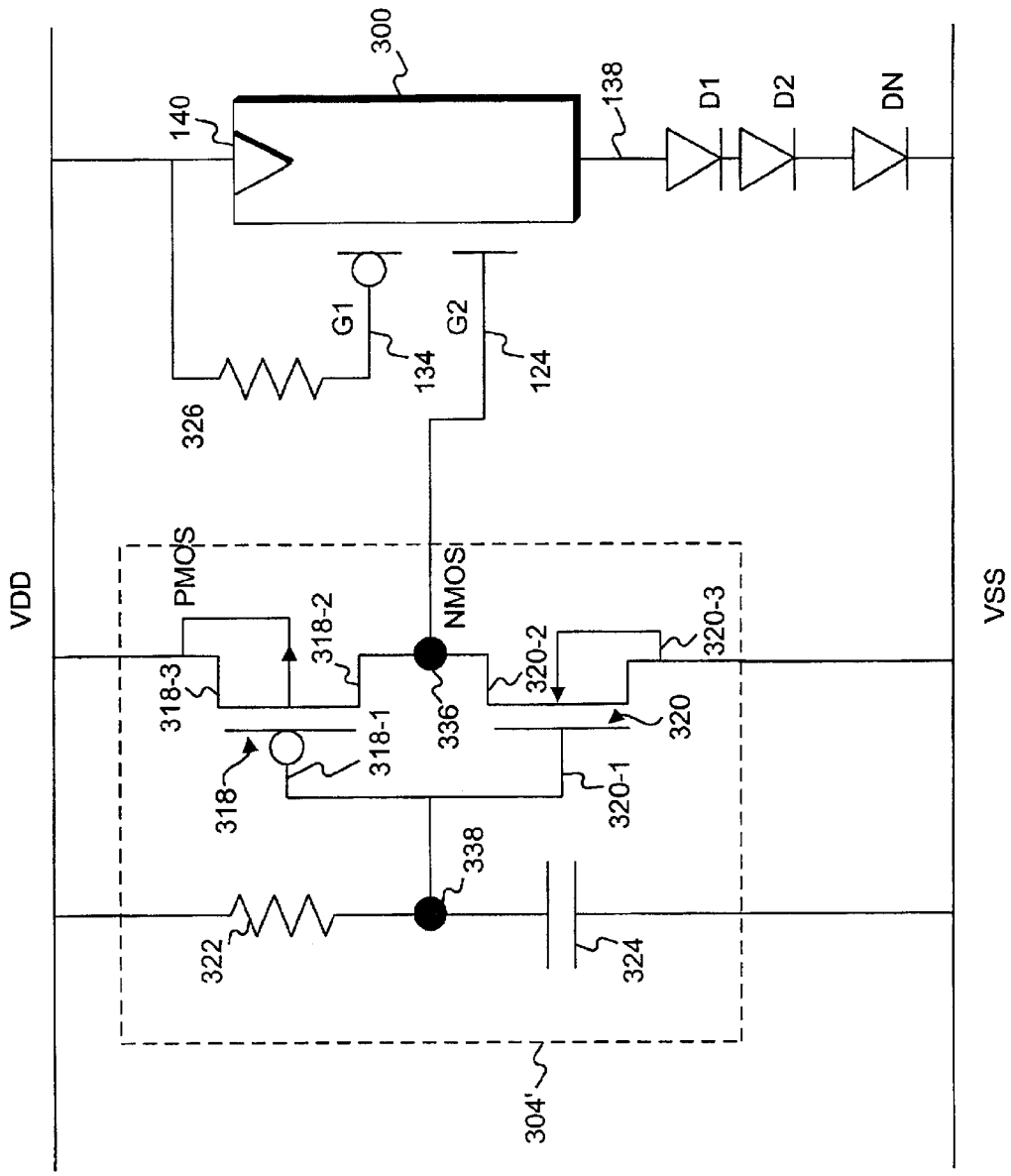
FIG. 8B is a detailed circuit diagram of FIG. 8A.

FIG. 8B is a detailed circuit diagram of FIG. 8A. Referring to FIG. 8B, ESD detecting circuit 304' includes an inverter having a transistor-pair, including a PMOS transistor 318 having a gate 318-1, a source region 318-3 and a drain region 318-2, and an NMOS transistor 320 having a gate 320-1, a source region 320-3 and a drain region 320-2. Gate 318-1 of PMOS transistor 318 is coupled to gate 320-1 of NMOS transistor 320. Gate 124 of SCR device 300 is coupled at node 336 to drain region 318-2 of PMOS transistor 318 and drain region 320-2 of the NMOS transistor 320. Source 318-3 of PMOS transistor 318 is coupled to VDD, as is anode 140 of SCR device 300. Source 320-3 of NMOS transistor 320 is coupled to VSS. Gate 134 of SCR device 300 is coupled to anode 140 through a resistor 326, which functions to protect the gate oxide layer of the PMOS transistor.

ESD detecting circuit 304' further includes a resistor 322 and a capacitor 324. Resistor 322 is coupled to VDD at one end, and at node 338 coupled to gate 318-1 of PMOS transistor 318, gate 320-1 of NMOS transistor 320, and capacitor 324 at the other end. Capacitor 324 is coupled between node 338 and VSS.

In operation, diodes D1 . . . Dn function to raise a holding voltage when SCR device 300 is triggered. The holding voltage must be higher than the voltage drop across the VDD-VSS power rails to avoid latch-up. In addition, the diodes prevent SCR device 300 from being latched-up if accidentally triggered by a noise signal during normal operation.

In normal operation, i.e., in the absence of an ESD event, node 338 is at a high voltage level, and the inverter functions to provide a low voltage at node 336. Therefore, a low voltage is provided to gate 124 of the NMOS transistor to keep the NMOS transistor off so that SCR device 300 remains off. Because gate 134 of the PMOS transistor is coupled to anode 140 and VDD, the PMOS transistor remains off, as does SCR device 300. During an ESD event, a positive ESD pulse is presented across the VDD-VSS power rails. Node 338 is, therefore, at a low voltage level, and through the inverter, a high voltage level is presented at node 336, which turns on the NMOS transistor of the SCR device 300. The SCR device 300 conducts to allow the ESD current to flow through the n-well of the NMOS transistor, producing a voltage drop. The ESD current is discharged from the VDD-VSS power rails through the SCR device 300 and diodes D1 . . . Dn.

Embodiments consistent with the present invention also provide a method for protecting a silicon-on-insulator semiconductor circuit from electrostatic discharge. The method includes providing an n-type MOS transistor having a source region and a drain region in the silicon-on-insulator circuit, providing a p-type MOS transistor having a source region and a drain region, the p-type MOS transistor being contiguous with the n-type transistor, providing a p-type region contiguous with one of the source region and the drain region of the n-type MOS transistor to form a cathode, and providing an n-type region contiguous with one of the source region and the drain region of the p-type MOS transistor to form an anode, wherein the n-type region, the p-type region, the p-type MOS transistor and the n-type MOS transistor form an SCR structure. The method of the present invention may also include biasing the p-type MOS transistor to trigger the SCR structure and biasing the n-type MOS transistor to trigger the SCR structure.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An integrated circuit device, comprising:

a semiconductor substrate;

an isolation layer formed over the semiconductor substrate; and a layer of silicon material, formed over the isolation layer, including a first p-type portion, a first n-type portion contiguous with the first p-type portion, a second p-type portion contiguous with the first n-type portion, a second n-type portion contiguous with the second p-type portion, a third p-type portion contiguous with the second n-type portion, a third n-type portion contiguous with the third p-type portion, and a fourth p-type portion formed entirely in the second n-type portion and spaced apart from the third p-type portion, wherein the second n-type portion includes the third n-type portion and the third p-type portion, each of which being spaced apart from the isolation layer, wherein the first, second, and third n-type portions and the first, second, and third n-type portions collectively form a rectifier, wherein the first n-type portion and the first n-type portion form a cathode of the rectifier, wherein the third n-type portion and the third p-type portion form an anode of the rectifier; and wherein the third p-type portion and the fourth p-type portion define a source region and a drain region of a PMOS transistor.

2. An integrated circuit device, comprising:

a semiconductor substrate;

an isolation layer formed over the semiconductor substrate; and a layer of silicon material, formed over the isolation layer, including a first p-type portion, a first n-type portion contiguous with the first p-type portion, a second p-type portion contiguous with the first n-type portion, a second n-type portion contiguous with the second p-type portion, a third p-type portion contiguous with the second n-type portion, a third n-type portion contiguous with the third p-type portion, and a fourth n-type portion formed entirely in the second p-type portion and spaced apart from the first n-type portion, wherein the first, second, and third p-type portions and the first, second, and third n-type portions collectively form a rectifier, wherein the first p-type portion and the first n-type portion form a cathode of the rectifier, wherein the third n-type portion and the third p-type portion form an anode of the rectifier; and wherein the first n-type portion and the fourth n-type portion define a source region and a drain region of an NMOS transistor.

3. The integrated circuit device as claimed in claim 2, wherein the second p-type portion is contiguous with the first p-type portion.

4. The integrated circuit device as claimed in claim 2, wherein the third n-type portion is contiguous with the second n-type portion.

5. The integrated circuit device as claimed in claim 2, wherein the second p-type portion includes the first n-type portion and the first p-type portion, each of which being spaced apart from the isolation layer.

6. The integrated circuit device as claimed in claim 2, wherein the first n-type portion and the first p-type portion are contiguous with the isolation layer.

7. The integrated circuit device as claimed in claim 2, wherein the NMOS transistor comprises a gate for receiving a voltage to turn on the NMOS transistor.

8. The integrated circuit device as claimed in claim 2, further comprising at least one isolation portion formed contiguous with the rectifier.

9. An integrated circuit device, comprising:

a semiconductor substrate;

an isolation layer formed over the semiconductor substrate; and a layer of silicon material, formed over the isolation layer, including a first p-type portion, a first n-type portion contiguous with the first p-type portion, a second p-type portion contiguous with the first n-type portion, a second n-type portion contiguous with the second p-type portion, a third p-type portion contiguous with the second n-type portion, a third n-type portion contiguous with the third p-type portion, and a fourth p-type portion formed entirely in the second n-type portion and spaced apart from the third p-type portion, wherein the first, second, and third p-type portions and the first, second, and third n-type portions collectively form a rectifier, wherein the first p-type portion and the first n-type portion form a cathode of the rectifier, wherein the third n-type portion and the third p-type portion form an anode of the rectifier; and wherein the third p-type portion and the fourth p-type portion define a source region and a drain region of a PMOS transistor.

10. The integrated circuit device as claimed in claim 9, wherein the third n-type portion and the third p-type portion are contiguous with the isolation layer.

11. The integrated circuit device as claimed in claim 9, further comprising at least one isolation portion formed contiguous with the rectifier.

12. The integrated circuit device as claimed in claim 9, wherein the second p-type portion is contiguous with the first p-type portion.

13. The integrated circuit device as claimed in claim 9, wherein the third n-type portion is contiguous with the second n-type portion.

14. The integrated circuit device as claimed in claim 9, wherein the PMOS transistor comprises a gate for receiving a voltage to turn on the PMOS.

15. The integrated circuit device as claimed in claim 14, wherein the gate of the PMOS transistor is coupled to the anode of the rectifier.

16. The integrated circuit device as claimed in claim 14, wherein the second p-type portion includes a fourth n-type portion formed spaced apart from the first n-type portion and contiguous with the fourth p-type portion, and wherein the first n-type portion and the fourth n-type portion define a source region and a drain region of an NMOS transistor.

17. An integrated circuit device, comprising:

a semiconductor substrate;

an isolation layer formed over the semiconductor substrate;

an n-type MOS transistor having a gate, a drain region, and a source region formed over the isolation layer; and a p-type MOS transistor having a gate, a drain region, and a source region formed over the isolation layer and contiguous with the n-type MOS transistor, wherein the n-type MOS transistor and the p-type MOS transistor form a rectifier to provide electrostatic discharge protection.

18. The integrated circuit device as claimed in claim 17, further comprising an electrostatic discharge circuit for providing a bias voltage to trigger the rectifier to provide electrostatic discharge protection, wherein the gate of the n-type MOS transistor is coupled to receive the bias voltage.

19. The integrated circuit device as claimed in claim 17 further comprising a first p-type region, wherein one of the source region and the drain region of the n-type MOS transistor and the first p-type region form a cathode of the rectifier.

20. The integrated circuit device as claimed in claim 19, wherein the cathode is coupled to at least one diode to prevent the rectifier from being triggered in a non-ESD operation.

21. The integrated circuit device as claimed in claim 17 further comprising a first n-type region, wherein one of the source region and the drain region of the p-type MOS transistor and the first n-type region form an anode of the rectifier.

22. The integrated circuit device as claimed in claim 21, wherein the anode of the rectifier is coupled to a pad to receive an electrostatic current.

23. The integrated circuit device as claimed in claim 17 further comprising an electrostatic discharge circuit for providing the bias voltage to trigger the rectifier, the electrostatic discharge circuit comprising a first inverter including a first PMOS transistor having a gate, a source region and a drain region, and a first NMOS transistor having a gate, a source region and a drain region, wherein the gate of the first PMOS transistor is coupled to the gate of the first NMOS transistor, and the gate of the n-type MOS transistor is coupled to the drain region of the first PMOS transistor and the drain region of the first NMOS transistor.

24. The integrated circuit device as claimed in claim 23, wherein the anode of the rectifier is coupled to the gate of the p-type MOS transistor.

25. The integrated circuit device as claimed in claim 23, wherein the gate of the first NMOS transistor and the gate of the first PMOS transistor are coupled in parallel to a resistor and a capacitor.

26. The integrated circuit device as claimed in claim 17 further comprising an electrostatic discharge circuit for providing the bias voltage to trigger the rectifier, the electrostatic discharge circuit comprising a first inverter including a first PMOS transistor having a gate, a source region and a drain region, and a first NMOS transistor having a gate, a source region and a drain region, wherein the gate of the first PMOS transistor is coupled to the gate of the first NMOS transistor, and the gate of the p-type MOS transistor is coupled to the drain region of the first PMOS transistor and the drain region of the first NMOS transistor.

27. The integrated circuit device as claimed in claim 26, wherein the gate of the p-type MOS transistor is coupled to receive the bias voltage to trigger the rectifier to provide electrostatic discharge protection.

28. The integrated circuit device as claimed in claim 26, wherein the source region of the first NMOS transistor is coupled to ground.

29. The integrated circuit device as claimed in claim 26, wherein the source region of the first PMOS transistor is coupled to a pad to receive an electrostatic current.

30. The integrated circuit device as claimed in claim 26, wherein the electrostatic discharge circuit further comprises a second inverter, including a second PMOS transistor having a gate, a source region and a drain region, and a second NMOS transistor having a gate, a source region and a drain region, wherein the gate of the second PMOS transistor is coupled to the gate of the second NMOS transistor, and the gate of the n-type MOS transistor is coupled to the drain region of the second PMOS transistor and the drain region of the second NMOS transistor.

31. The integrated circuit device as claimed in claim 30, wherein the source region of the second NMOS transistor is coupled to ground.

32. The integrated circuit device as claimed in claim 30, wherein the source region of the second PMOS transistor is coupled to a pad to receive an electrostatic current.

33. A method for protecting a silicon-on-insulator semiconductor circuit from electrostatic discharge, comprising:
providing an n-type MOS transistor having a source region and a drain region in the silicon-on-insulator circuit;
providing a p-type MOS transistor having a source region and a drain region, the p-type MOS transistor being contiguous with the n-type MOS transistor;
providing a p-type region contiguous with one of the source region and the drain region of the n-type MOS transistor to form a cathode; and
providing an n-type region contiguous with one of the source region and the drain region of the p-type MOS transistor to form an anode, wherein the n-type region, the p-type region, the p-type MOS transistor and the n-type MOS transistor form a rectifier.

34. The method as claimed in claim 33, further comprising a step of biasing the p-type MOS transistor to trigger the rectifier.

35. The method as claimed in claim 33, further comprising a step of biasing the n-type MOS transistor to trigger the rectifier.

* * * * *

UNITED STATES PATENT AND TRADEMARK OFFICE
CERTIFICATE OF CORRECTION

PATENT NO. : 6,750,515 B2
DATED : June 15, 2004
INVENTOR(S) : Ming-Dou Ker et al.

It is certified that error appears in the above-identified patent and that said Letters Patent is hereby corrected as shown below:

<u>Column 9,</u>
Line 22, "n-type portions and" should read -- p-type portions and --.
Line 25, "n-type portion and" should read -- p-type portion and --.

Signed and Sealed this

Fourteenth Day of December, 2004

JON W. DUDAS
*Director of the United States Patent and Trademark Office*